United States Patent
Mahajan et al.

(10) Patent No.: US 11,222,847 B2
(45) Date of Patent: Jan. 11, 2022

(54) ENABLING LONG INTERCONNECT BRIDGES

(71) Applicant: Intel Corporation, Santa Clara, CA (US)

(72) Inventors: Ravindranath V. Mahajan, Chandler, AZ (US); Zhiguo Qian, Chandler, AZ (US); Henning Braunisch, Phoenix, AZ (US); Kemal Aygun, Tempe, AZ (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/469,084

(22) PCT Filed: Dec. 28, 2016

(86) PCT No.: PCT/US2016/068876
§ 371 (c)(1),
(2) Date: Jun. 12, 2019

(87) PCT Pub. No.: WO2018/125080
PCT Pub. Date: Jul. 5, 2018

(65) Prior Publication Data
US 2019/0318993 A1   Oct. 17, 2019

(51) Int. Cl.
*H01L 23/538*   (2006.01)
*H01L 25/065*   (2006.01)

(52) U.S. Cl.
CPC ...... *H01L 23/5381* (2013.01); *H01L 23/5385* (2013.01); *H01L 25/0655* (2013.01); *H01L 23/5383* (2013.01); *H01L 2224/16225* (2013.01)

(58) Field of Classification Search
CPC ............... H01L 23/5231; H01L 23/538–5389
See application file for complete search history.

(56) References Cited

U.S. PATENT DOCUMENTS 9,490,198 B1 * 11/2016 Eom .................. H01L 23/5384
2007/0043894 A1 * 2/2007 Zingher ................ H01L 23/48
                                                                710/310
2011/0233764 A1   9/2011 Chang et al.
(Continued)

FOREIGN PATENT DOCUMENTS

KR   1020130076749 A   7/2013
TW      201618232 A   5/2016
(Continued)

OTHER PUBLICATIONS

"International Application Serial No. PCT/US2016/068876, International Search Report dated Sep. 28, 2017", 3 pgs.
(Continued)

*Primary Examiner* — Kevin Parendo
(74) *Attorney, Agent, or Firm* — Schwegman Lundberg & Woessner, P.A.

(57) ABSTRACT

A device and method of utilizing a repeater circuit to extend the viable length of an interconnect bridge. Integrated circuit packages using a repeater circuit in a repeater die, embedded in a substrate, and included in an interconnect bridge are show. Methods of connecting semiconductor dies using interconnect bridges coupled with repeater circuits are shown.

19 Claims, 8 Drawing Sheets

(56) References Cited

U.S. PATENT DOCUMENTS

| | | |
|---|---|---|
| 2013/0249109 A1* | 9/2013 | Ma .................... B81C 1/00301 |
| | | 257/774 |
| 2014/0321804 A1 | 10/2014 | Thacker et al. |
| 2015/0200182 A1 | 7/2015 | Wang |
| 2016/0358899 A1 | 12/2016 | Lee et al. |
| 2017/0098638 A1* | 4/2017 | Thuaire .................. H01L 25/50 |

FOREIGN PATENT DOCUMENTS

| | | |
|---|---|---|
| TW | 201841328 A | 11/2018 |
| WO | WO-2018125080 A1 | 7/2018 |

OTHER PUBLICATIONS

"International Application Serial No. PCT/US2016/068876, Written Opinion dated Sep. 28, 2017", 10 pgs.

"Taiwanese Application Serial No. 106141222, Response filed Apr. 14, 2021 to Office Action dated Mar. 9, 2021", With English claims, 51 pages.

"International Application Serial No. PCT/US2016/068876, International Preliminary Report on Patentability dated Jul. 11, 2019", 12 pgs.

"Taiwanese Application Serial No. 106141222, Office Action dated Mar. 9, 2021", w/ English Translation of Search Report, 6 pgs.

\* cited by examiner

ENABLING LONG INTERCONNECT BRIDGES

PRIORITY APPLICATION

This patent application is a U.S. National Stage Application under 35 U.S.C. 371 from International Application No, PCT/US2016/068876, filed Dec. 28, 2016, published as WO 2018/125080, which is incorporated herein by reference in its entirety.

TECHNICAL FIELD

Embodiments described herein generally relate to die interconnect bridges for microelectronic devices.

BACKGROUND

Microelectronic devices such as integrated circuit packages often use a substrate to attach silicon dies to a larger circuit board, often called a motherboard. The substrate helps to support and protect the silicon dies, provide heat dissipation, and enable signal and power distribution. When multiple silicon dies are attached to a single substrate an interconnect bridge can be utilized to electrically couple the silicon dies.

DESCRIPTION OF EMBODIMENTS

Figure 1:
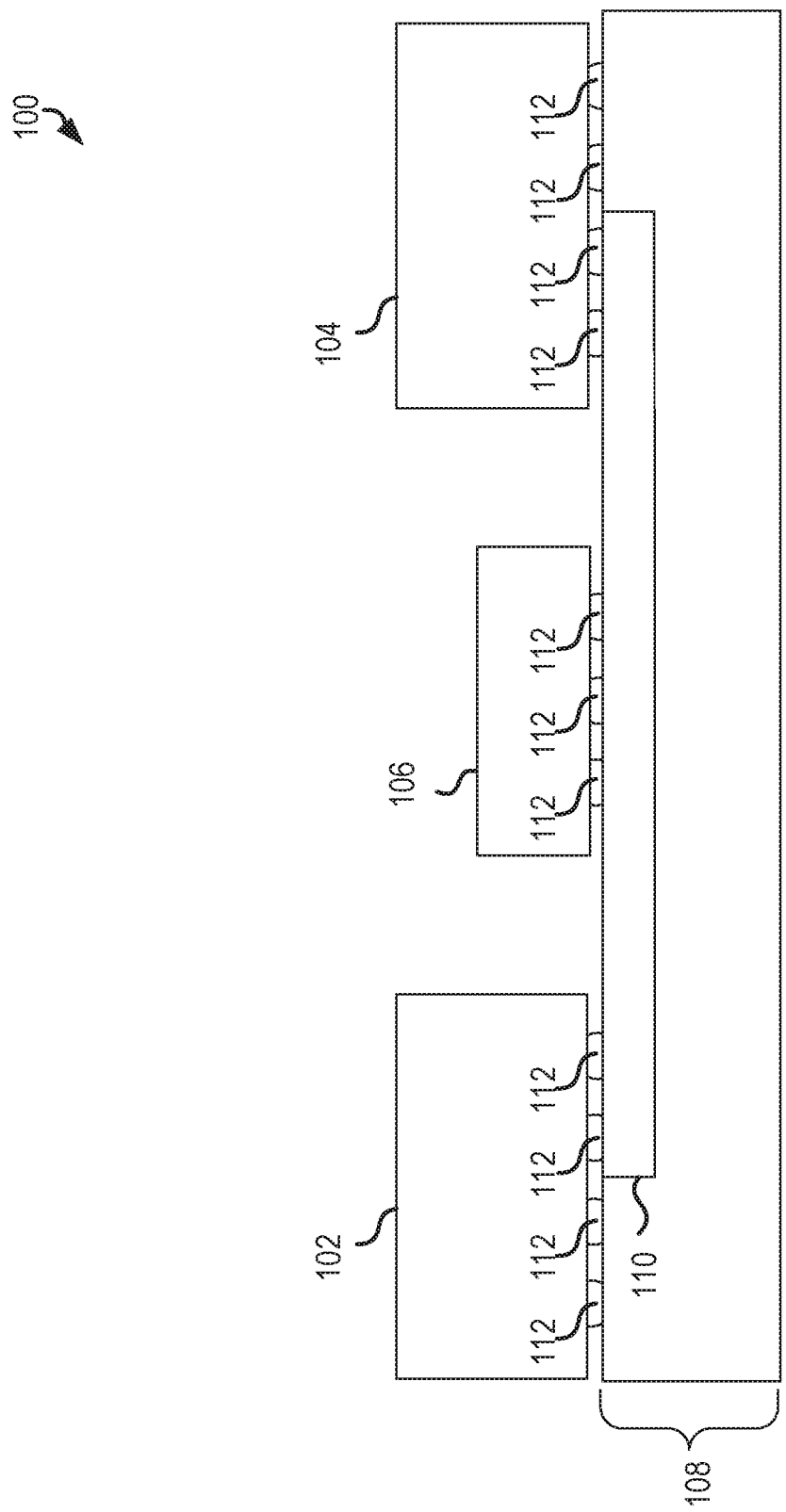
FIG. 1 is an example cross-sectional view of an integrated circuit package utilizing a die interconnect bridge, coupled with a repeater die, to electrically couple two semiconductor dies.

FIG. 1 shows one example of a cross-sectional view of an integrated circuit package 100 utilizing a die interconnect bridge 110, coupled with a repeater die 106, to electrically couple a first semiconductor die 102 and a second semiconductor die 104. The semiconductor dies and the repeater die 106 are attached to a substrate 108 and the interconnect bridge 110 using a plurality of interconnects 112. The repeater die 106 allows for a longer interconnect bridge 110 and greater distance between the first semiconductor die 102 and the second semiconductor die 104. The interconnect bridge 110 includes outputs and inputs for electrical coupling to the repeater die 106. In some examples, the interconnect bridge 110 is a silicon interconnect bridge. In some examples, the interconnect bridge 110 is passive. The passive interconnect bridge can be made of materials that include one or more of silicon, glass, polymer, and ceramic.

Interconnect bridges can be subject to signal loss and degradation that increases as the length of the signal transmission of the interconnect bridges increase. Signal loss and degradation can also increase as the data transfer rate increases. By using a repeater die 106 electrically coupled to the interconnect bridge 110, the signal loss and degradation can be overcome and signal integrity maintained over longer interconnect bridges and higher data transfer rates. In some examples, the interconnect bridge 110 is passive while the repeater die 106 is active. The repeater die 106 provides periodic boosts to the signal traveling through the interconnect bridge 110 while maintaining the slew rate and edges of the signal. The repeater die 106 allows for more die configurations on the substrate 108 because the length restriction of the interconnect bridge 110 is overcome when using the repeater die 106.

Figure 2:
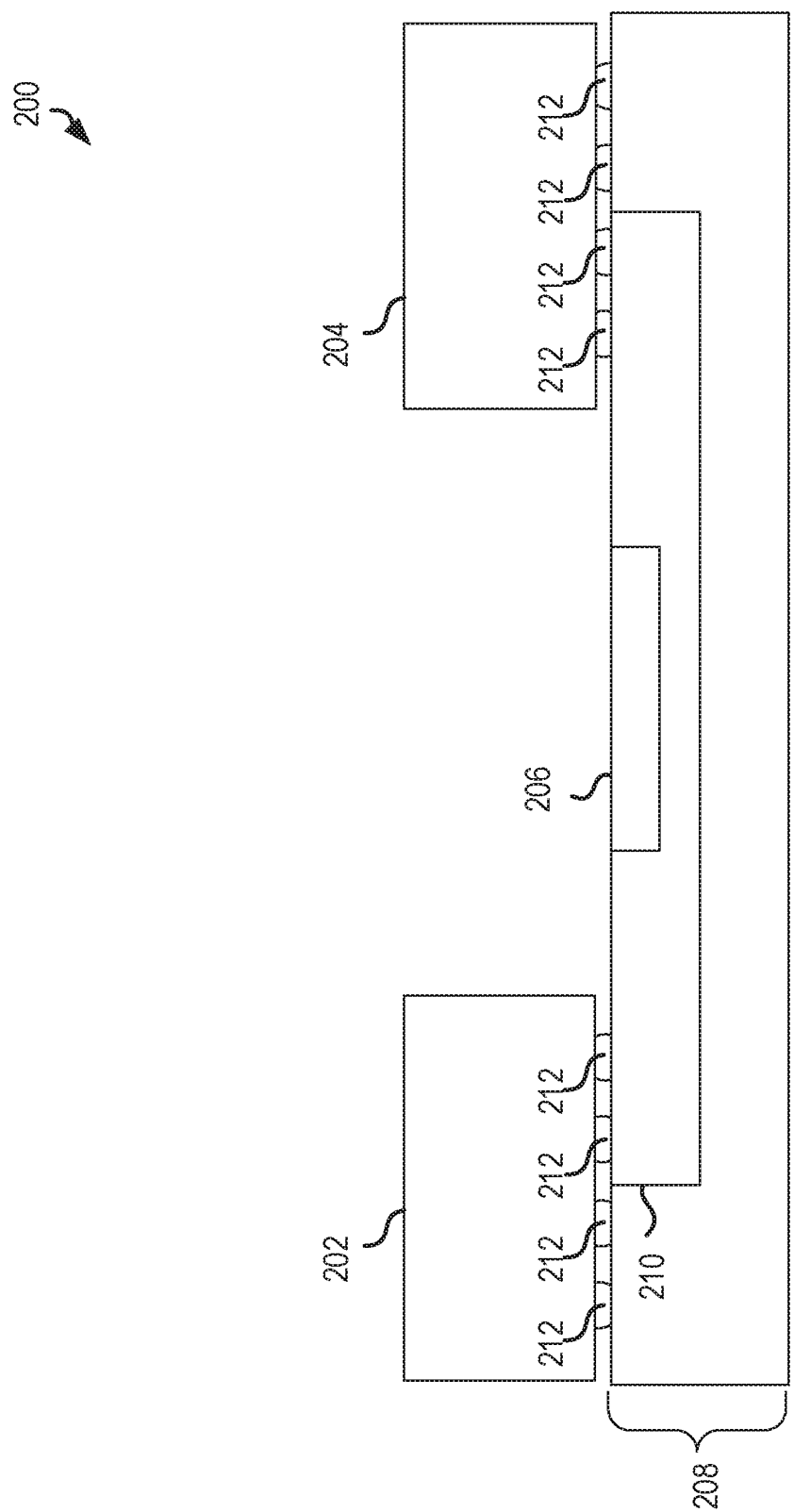
FIG. 2 is an example cross-sectional view of an integrated circuit package utilizing a die interconnect bridge, coupled with a repeater circuit, to electrically couple two semiconductor dies.

FIG. 2 shows one example of a cross-sectional view of an integrated circuit package 200 utilizing a die interconnect bridge 210, coupled with a repeater circuit 206, to electrically couple a first semiconductor die 202 to a second semiconductor die 204. The first and second semiconductor dies are attached to a substrate 208 and the interconnect bridge 210 using a plurality of interconnects 212. In some examples, the repeater circuit 206 is at least partially embedded in the substrate 208. An embedded repeater circuit 206 requires no space on the surface of the substrate 208 which can free up the surface space for semiconductor dies or other uses.

In some examples, the repeater circuit 206 is wider than the interconnect bridge 210. The repeater circuit 206 can be powered through portions of the repeater circuit, by the substrate 208, that extend past the interconnect bridge 210. In some examples, the repeater circuit 206 extends past only one side of the interconnect bridge 210. In some examples, the repeater circuit 206 extends past two sides of the interconnect bridge 210. In some examples, the repeater circuit 206 is included in the interconnect bridge 210. When the repeater circuit 206 is included in the interconnect bridge it can be powered through the interconnect bridge 210. In some examples, the interconnect bridge 210 is a silicon interconnect bridge. In some examples, the interconnect bridge 210 is passive. The passive interconnect bridge can be made of materials that include silicon, glass, polymer, or ceramic.

Figure 3:
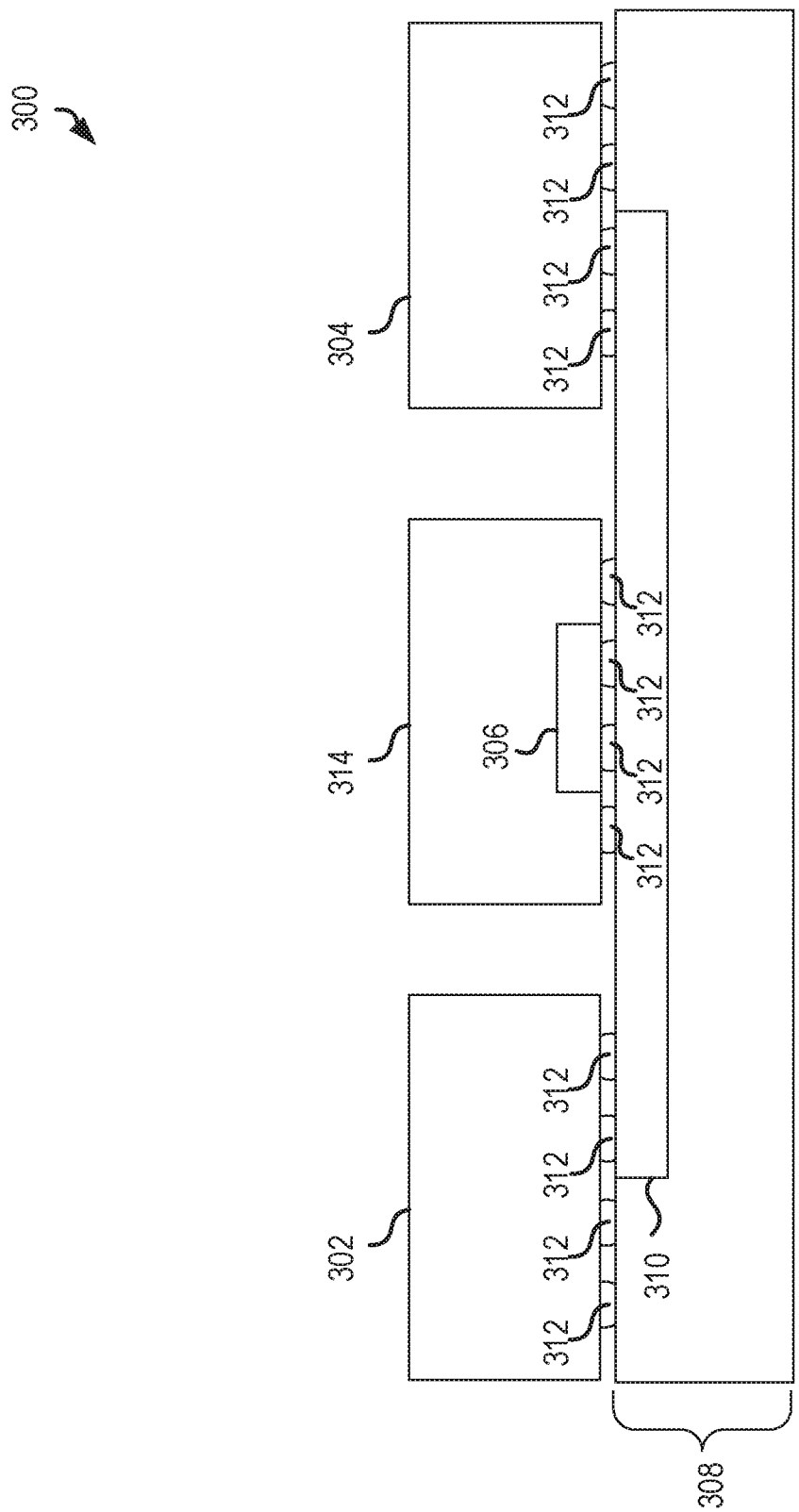
FIG. 3 is an example cross-sectional view of an integrated circuit package utilizing a die interconnect bridge, coupled with a repeater circuit, to electrically couple three semiconductor dies.

FIG. 3 shows one example of a cross-sectional view of an integrated circuit package 300 utilizing a die interconnect bridge 310, coupled with a repeater circuit 306, to electrically couple a first semiconductor die 302, a second semiconductor die 314, and a third semiconductor die 304. The semiconductor dies and the repeater circuit 306 are attached to a substrate 308 and the interconnect bridge 310 using a plurality of interconnects 312. In some examples, the interconnect bridge 310 is a silicon interconnect bridge. In some examples, the interconnect bridge 310 is passive. The passive interconnect bridge can be made of materials that include silicon, glass, polymer, or ceramic.

In some examples, the repeater circuit 306 is included in the second semiconductor die 314, allowing the interconnect bridge 310 to electrically couple three semiconductor dies using a single repeater circuit 306. This configuration also has the benefit of not requiring surface space on the substrate 308 just for the repeater circuit. This also allows the semiconductor dies to be side by side allowing more efficient cooling. In some examples, two repeater circuits are used by having a repeater circuit between each of the semiconductor dies, thereby using two repeater circuits on the interconnect bridge 310.

In some examples, more than three semiconductor dies are electrically connected to a single interconnect bridge 310. In some examples a repeater circuit is electrically coupled to the interconnect bridge 310 in between each semiconductor die attached to the interconnect bridge 310. In some examples, each semiconductor die attached to the interconnect bridge 310, except the two semiconductor dies attached at either end of the interconnect bridge 310, includes a repeater circuit. In some examples, some of the semiconductor dies include a repeater circuit, and some repeater circuits are electrically coupled to the interconnect bridge 310 independent of a semiconductor die.

Figure 4:
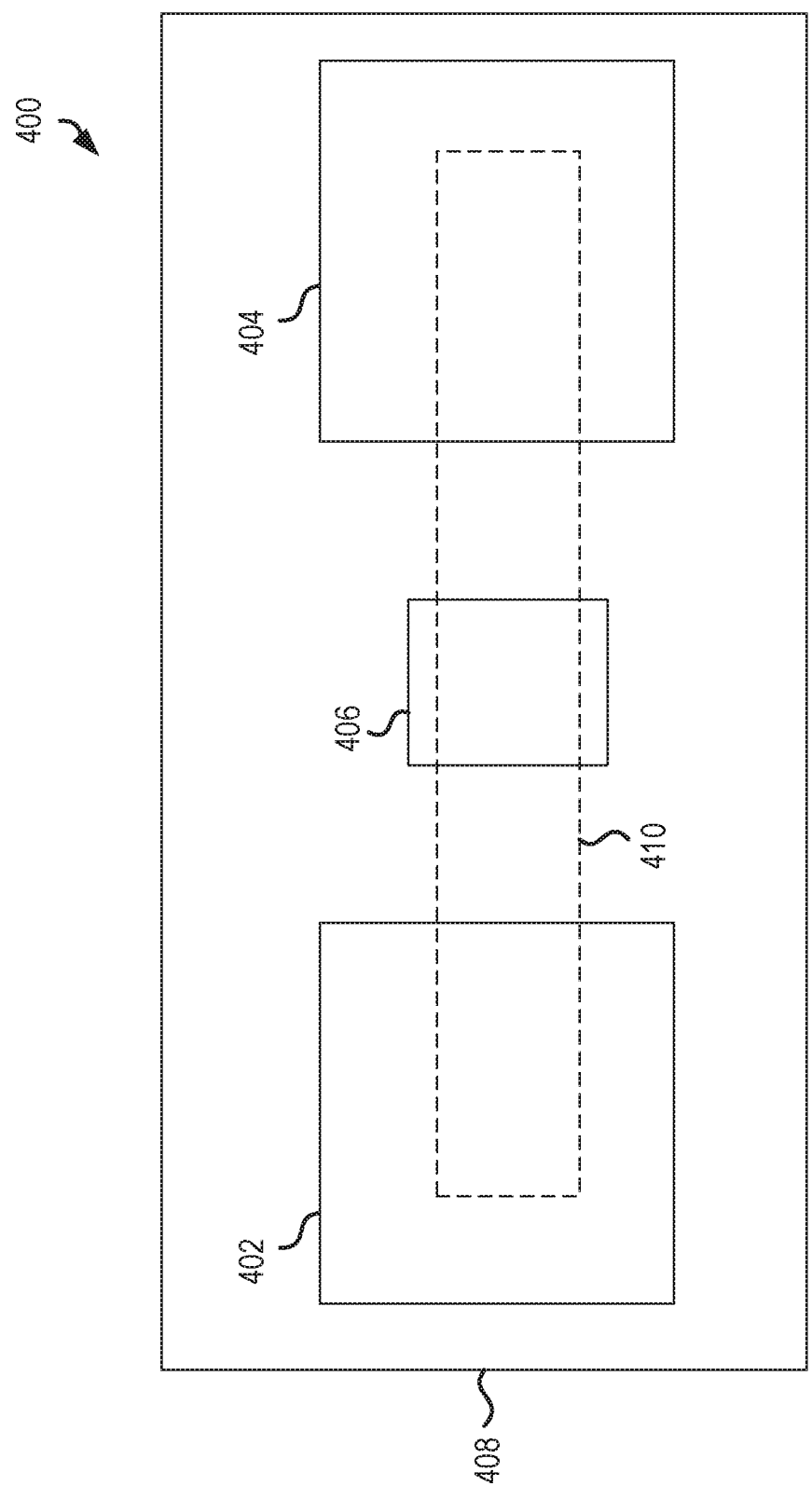
FIG. 4 is an example overhead view of an integrated circuit package utilizing a die interconnect bridge, coupled with a repeater circuit, to electrically couple two semiconductor dies.

FIG. 4 shows one example of an overhead view of an integrated circuit package 400 utilizing a die interconnect bridge 410, coupled with a repeater circuit 406, to electrically couple a first semiconductor die 402 and a second semiconductor die 404 on a substrate 408. The semiconductor dies are attached to a substrate 408. In some examples the repeater circuit 406 is a repeater die. The repeater die is attached to the substrate 408 and electrically coupled to the interconnect bridge 410. Repeater die can be used on many integrated circuit package designs without requiring semiconductor dies to include repeater circuits or substrates with embedded repeater circuits. The repeater die can extend past the edges of the interconnect bridge 410 and be powered through the substrate 408.

In some examples, the repeater circuit 406 is attached to the interconnect bridge 410 and the subassembly is embedded in the substrate 408. This frees up surface space on the substrate 408 for various die configurations. The repeater circuit 406 is powered through the interconnect bridge 410. In some examples, the repeater circuit 406 is included in the interconnect bridge 410 and powered through the interconnect bridge 410. In some examples, the interconnect bridge 410 is a silicon interconnect bridge. In some examples, the interconnect bridge 410 is passive. The passive interconnect bridge can be made of materials that include silicon, glass, polymer, or ceramic.

Figure 5:
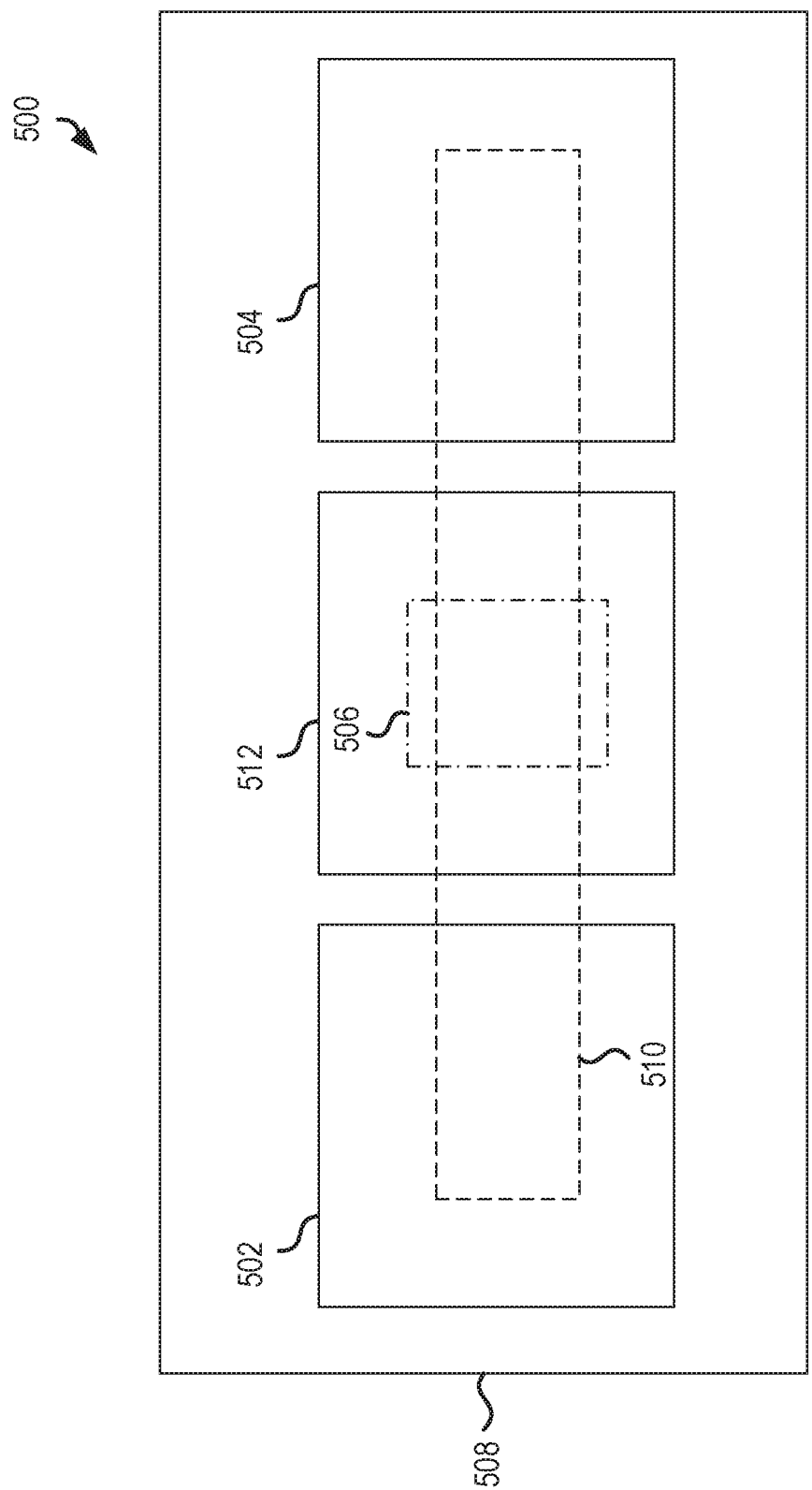
FIG. 5 is an example overhead view of an integrated circuit package utilizing a die interconnect bridge, coupled with a repeater circuit, to electrically couple three semiconductor dies.

FIG. 5 shows one example of an overhead view of an integrated circuit package 500 utilizing a die interconnect bridge 510, coupled with a repeater circuit 506, to electrically couple a first semiconductor die 502, a second semiconductor die 512, and a third semiconductor die 504. The semiconductor dies are attached to a substrate 508. The repeater circuit 506 is included in the second semiconductor die 512. This allows use of the repeater circuit 506 in order to use a longer interconnect bridge 510 such that the interconnect bridge 510 can electrically couple three semiconductor dies instead of just two.

In some examples, more than three semiconductor dies are electrically connected to a single interconnect bridge 510. In some examples a repeater circuit is electrically coupled to the interconnect bridge 510 in between each semiconductor die attached to the interconnect bridge 510. In some examples, each semiconductor die attached to the interconnect bridge 510, except the two semiconductor dies attached at either end of the interconnect bridge 510, includes a repeater circuit. In some examples, some of the semiconductor dies include a repeater circuit, and some repeater circuits are electrically coupled to the interconnect bridge 510 independent of a semiconductor die. In some examples, the interconnect bridge 510 is a silicon interconnect bridge. In some examples, the interconnect bridge 510 is passive. The passive interconnect bridge can be made of materials that include silicon, glass, polymer, or ceramic.

Figure 6:
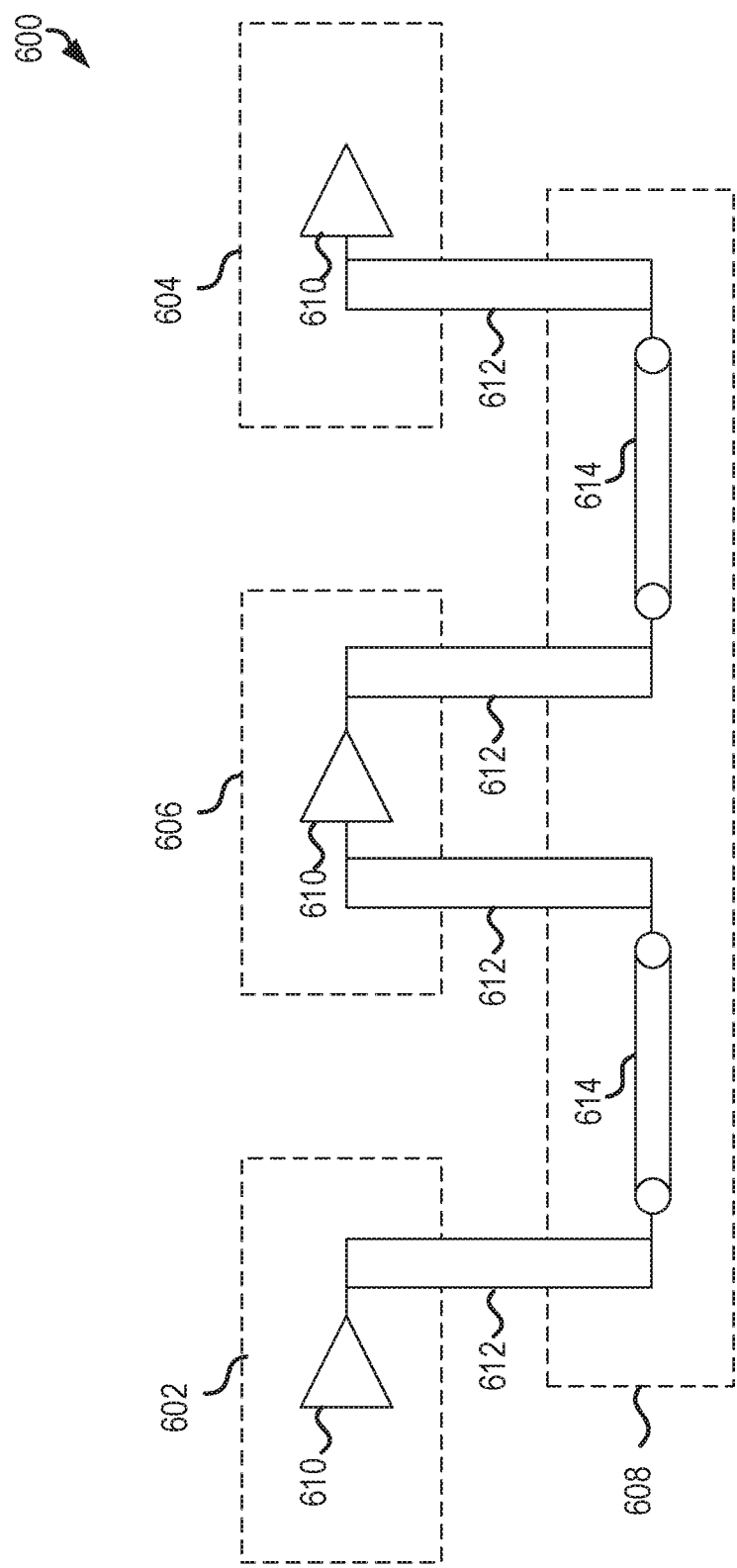
FIG. 6 is an example schematic of an integrated circuit package utilizing a die interconnect bridge, coupled with a repeater circuit, to electrically couple two semiconductor dies.

FIG. 6 shows an example of a schematic 600 of an integrated circuit package utilizing a die interconnect bridge 608, coupled with a repeater circuit 606, to electrically couple a first semiconductor die 602 and a second semiconductor die 604. The semiconductor dies and the repeater circuit 606 each include a driver and receiver 610 for receiving and driving a signal. The drivers and receivers 610 are electrically coupled to the die interconnect bridge 608 using a plurality of interconnects 612. The die interconnect bridge includes signal paths 614 for a signal from one of the plurality of interconnects 612 to another. Signal paths 614 can include traces, optical signal carriers, or other conductive structures.

In some examples, the drivers and receivers 610 are of substantially similar size. Using drivers and receivers 610 that are substantially similar in size in the semiconductor dies as well as the repeater circuit 606, the signal rise and fall time can be maintained. Thus, signal integrity is ensured for a longer interconnect bridge 608.

Figure 7:
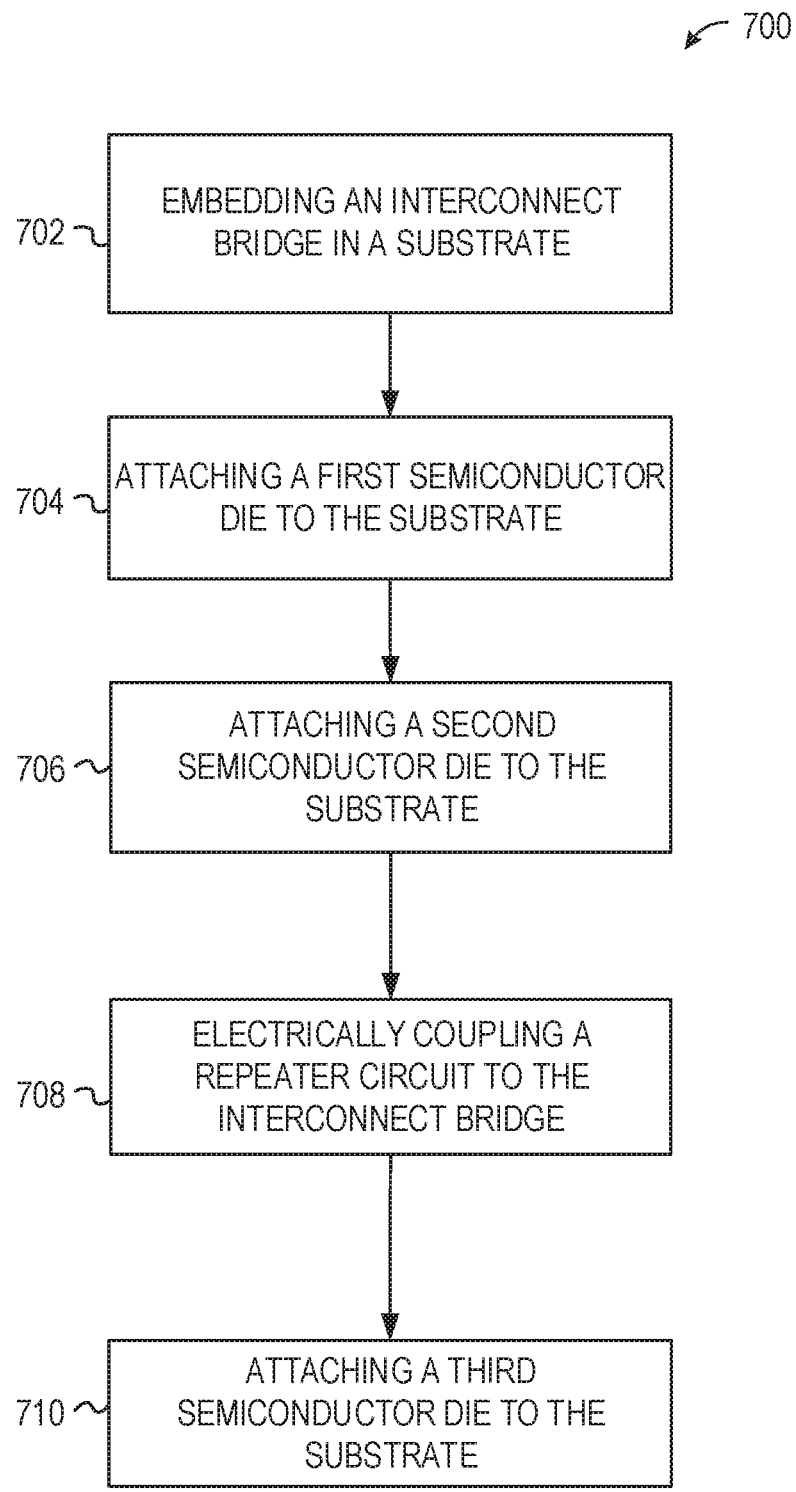
FIG. 7 is a process diagram of a method in accordance with some embodiments of the invention.

FIG. 7 shows steps in an example process 700 of electrically coupling semiconductor dies using an interconnect bridge and a repeater circuit. In FIG. 7 an interconnect bridge is at least partially embedded in a substrate 702. A first semiconductor die is attached to the substrate 704. A second semiconductor die is attached to the substrate 706. A repeater circuit is electrically coupled to the interconnect bridge 708. A third semiconductor die is attached to the substrate 710. In some examples, the interconnect bridge is a lithographically created interconnect bridge. In some examples, the interconnect bridge is a silicon interconnect bridge. In some examples, the interconnect bridge is passive. The passive interconnect bridge can be made of materials that include silicon, glass, polymer, or ceramic.

In some examples the repeater circuit is included in a repeater semiconductor die. This allows for a package that can be used in many different IC packages. In some examples, the repeater circuit is included in the interconnect bridge. Incorporating the repeater circuit in the interconnect bridge frees up space on the substrate surface. The repeater circuit is powered through the interconnect bridge. In some examples, the repeater circuit is included in one of the semiconductor dies. This frees up space on the substrate surface and allows for an interconnect bridge without a built-in repeater circuit. In some examples, a plurality of repeater circuits is electrically coupled to the interconnect bridge. The plurality of repeater circuits can be used to further extend the length of the interconnect bridge and in some examples, electrically couple a plurality of semiconductor dies.

In some examples, attaching the semiconductor dies to the substrate includes electrically coupling the semiconductor dies to the interconnect bridge. The semiconductor dies can be electrically coupled at either end of the interconnect bridge or somewhere in-between either end.

Figure 8:
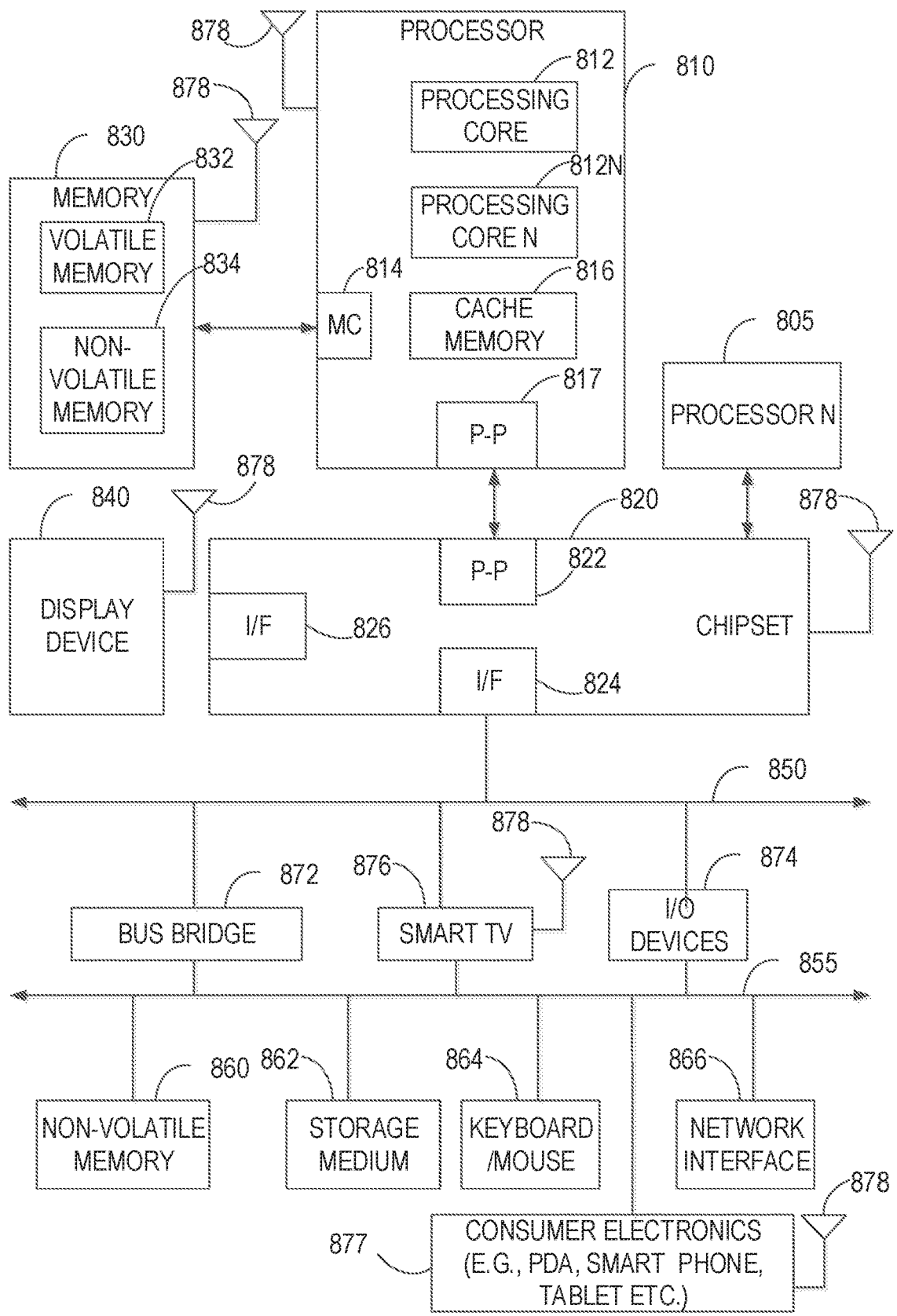
FIG. 8 is a block diagram of an electronic system in accordance with some embodiments of the invention.

FIG. 8 illustrates a system level diagram, according to one embodiment of the invention. For instance, FIG. 8 depicts an example of an electronic device (e.g., system) including the IC package utilizing spiral interconnects as described in the present disclosure. FIG. 8 is included to show an example of a higher level device application for the present invention. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processing cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to electrically couple to other elements in system 800. In some embodiments of the invention, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices 872, 876, 874, 860, 862, 864, 866, 877, etc. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a plasma display, cathode ray tube (CRT) display, or any other form of visual display device. In some embodiments of the invention, processor 810 and chipset 820 are merged into a single SOC. In addition, chipset 820 connects to one or more buses 850 and 855 that interconnect various elements 874, 860, 862, 864, and 866. Buses 850 and 855 may be interconnected together via a bus bridge 872. In one embodiment, chipset 820, via interface 824, couples with a non-volatile memory 860, a mass storage device(s) 862, a keyboard/mouse 864, a network interface 866, smart TV 876, consumer electronics 877, etc.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

To better illustrate the method and apparatuses disclosed herein, a non-limiting list of embodiments is provided here:

Example 1 is a semiconductor device, comprising: a substrate; a first semiconductor die attached to the substrate; a second semiconductor die attached to the substrate; an interconnect bridge electrically coupled to the first semiconductor die and the second semiconductor die; and a repeater circuit electrically coupled to the interconnect bridge along a communication path between the first semiconductor die and the second semiconductor die.

In Example 2, the subject matter of Example 1 optionally includes a repeater die, including the repeater circuit; and wherein the repeater die is attached to the substrate between the first semiconductor die and the second semiconductor die.

In Example 3, the subject matter of Example 2 optionally includes wherein a first edge of the repeater die extends past a first edge of the interconnect bridge creating a first repeater die overhang; and wherein the first repeater die overhang is used for power delivery to the repeater die.

In Example 4, the subject matter of Example 3 optionally includes wherein a second edge of the repeater die extends past a second edge of the interconnect bridge creating a second repeater die overhang; and wherein the second repeater die overhang is used for power delivery to the repeater die.

In Example 5, the subject matter of any one or more of Examples 1-4 optionally include wherein the repeater circuit is at least partially embedded within the substrate.

In Example 6, the subject matter of Example 5 optionally includes wherein the repeater circuit is powered via the interconnect bridge.

In Example 7, the subject matter of any one or more of Examples 1-6 optionally include a third semiconductor die attached to the substrate; and wherein the third semiconductor die is electrically coupled to the interconnect bridge.

In Example 8, the subject matter of Example 7 optionally includes wherein the third semiconductor die is located between the first semiconductor die and the second semiconductor die; wherein the third semiconductor die is a memory die; and wherein the third semiconductor die includes the repeater circuit.

In Example 9, the subject matter of any one or more of Examples 1-8 optionally include wherein the repeater circuit includes a signal receiver and a signal driver; wherein the first semiconductor die includes a signal receiver and a signal driver; wherein the second semiconductor die includes a signal receiver and a signal driver; wherein the signal receivers of the repeater circuit, the first semiconductor die, and the second semiconductor die are the same size; and wherein the signal drivers of the repeater circuit, the first semiconductor die, and the second semiconductor die are the same size.

In Example 10, the subject matter of any one or more of Examples 1-9 optionally include wherein the repeater circuit is included in the interconnect bridge.

In Example 11, the subject matter of any one or more of Examples 1-10 optionally include wherein the interconnect bridge is a silicon interconnect bridge embedded within the substrate.

Example 12 is a semiconductor device comprising: a substrate; a first semiconductor die attached to the substrate; a second semiconductor die attached to the substrate; a silicon interconnect bridge at least partially embedded in the substrate, the silicon interconnect bridge electrically coupled to the first semiconductor die and the second semiconductor die; and a repeater circuit electrically coupled to the silicon interconnect bridge along a communication path between the first semiconductor die and the second semiconductor die.

In Example 13, the subject matter of Example 12 optionally includes a repeater die, including the repeater circuit; and wherein the repeater die is attached to the substrate between the first semiconductor die and the second semiconductor die.

In Example 14, the subject matter of Example 13 optionally includes wherein a first edge of the repeater die extends past a first edge of the silicon interconnect bridge creating a first repeater die overhang; and Wherein the first repeater die overhang is used for power delivery to the repeater die.

In Example 15, the subject matter of Example 14 optionally includes wherein a second edge of the repeater die extends past a second edge of the silicon interconnect bridge creating a second repeater die overhang; and wherein the second repeater die overhang is used for power delivery to the repeater die.

In Example 16, the subject matter of any one or more of Examples 12-15 optionally include a third semiconductor die attached to the substrate; and wherein the third semiconductor (lie is electrically coupled to the silicon interconnect bridge.

In Example 17, the subject matter of Example 16 optionally includes wherein the third semiconductor die is located between the first semiconductor die and the second semiconductor die; and wherein the second semiconductor die includes the repeater circuit.

In Example 18, the subject matter of Example 17 optionally includes wherein the third semiconductor die is a memory die.

In Example 19, the subject matter of any one or more of Examples 12-18 optionally include wherein the repeater circuit includes a signal receiver and a signal driver; and wherein the first semiconductor die includes a signal receiver and a signal driver; wherein the second semiconductor die includes a signal receiver and a signal driver; wherein the signal receivers of the repeater circuit, the first semiconductor die, and the second semiconductor die are the same size; and wherein the signal drivers of the repeater circuit, the first semiconductor die, and the second semiconductor die are the same size.

In Example 20, the subject matter of any one or more of Examples 12-19 optionally include wherein the repeater circuit is included in the silicon interconnect bridge.

In Example 21, the subject matter of Example 20 optionally includes wherein the repeater circuit is powered via the silicon interconnect bridge.

Example 22 is a method comprising: embedding, at least partially, a lithographically created interconnect bridge in a substrate; attaching a first semiconductor die to the substrate, including electrically coupling the first semiconductor to a first end of the interconnect bridge; attaching a second semiconductor die to the substrate, including electrically coupling the second semiconductor die to the interconnect bridge; and coupling, electrically, a repeater circuit to the interconnect bridge along a communication path between the first semiconductor die and the second semiconductor die.

In Example 23, the subject matter of Example 22 optionally includes wherein the second semiconductor die is electrically coupled to a second end of the interconnect bridge; and wherein the repeater circuit is located in between the first end and the second end of the interconnect bridge.

In Example 24, the subject matter of any one or more of Examples 22-23 optionally include attaching a third semiconductor die attached to the substrate, including electrically coupling the third semiconductor die to the interconnect bridge; wherein the repeater circuit is included in the second semiconductor die; and wherein the second semiconductor die is electrically coupled to the interconnect bridge in between the first semiconductor die and the third semiconductor die.

In Example 25, the subject matter of any one or more of Examples 22-24 optionally include wherein the interconnect bridge is a silicon interconnect bridge.

In Example 26, the subject matter of any one or more of Examples 23-25 optionally include wherein the repeater circuit is included in a repeater semiconductor die.

These and other examples and features of the present long interconnect bridge, interconnect bridge systems, and related methods will be set forth in part in the following detailed description. This overview is intended to provide non-limiting examples of the present subject matter it is not intended to provide an exclusive or exhaustive explanation. The detailed description below is included to provide further information about the present interconnects, interconnect systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof)shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A semiconductor device, comprising:
   a substrate;
   a first semiconductor die attached to the substrate;
   a second semiconductor die attached to the substrate;
   an interconnect bridge electrically coupled to the first semiconductor die and the second semiconductor die; and
   a repeater die, including a repeater circuit, the repeater die is electrically coupled to the interconnect bridge along a communication path between the first semiconductor die and the second semiconductor die, the repeater die is attached to the substrate between the first semiconductor die and the second semiconductor die;
   wherein a first edge of the repeater die extends past a first edge of the interconnect bridge creating a first repeater die overhang, and wherein the first repeater die overhang is used for power delivery to the repeater die.

2. The semiconductor device of claim 1, wherein a second edge of the repeater die extends past a second edge of the interconnect bridge creating a second repeater die overhang; and
   wherein the second repeater die overhang is used for power delivery to the repeater die.

3. The semiconductor device of claim 1, wherein the repeater circuit is at least partially embedded within the substrate.

4. The semiconductor device of claim 1, wherein the repeater die includes a memory die.

5. The semiconductor device of claim 1, wherein the repeater circuit includes a repeater circuit signal receiver and a repeater circuit signal driver;
   wherein the first semiconductor die includes a first signal receiver and a first signal driver;
   wherein the second semiconductor die includes a second signal receiver and a second signal driver;
   wherein the repeater circuit signal receiver, the first signal receiver, and the second signal receiver are the same size; and
   Wherein the repeater circuit signal driver, the first signal driver, and the second signal driver are the same size.

6. The semiconductor device of claim 1, wherein the interconnect bridge is a silicon interconnect bridge embedded within the substrate.

7. A semiconductor device comprising:
   a substrate;
   a first semiconductor die attached to the substrate;
   a second semiconductor die attached to the substrate;
   a silicon interconnect bridge at least partially embedded in the substrate, the silicon interconnect bridge electrically coupled to the first semiconductor die and the second semiconductor die, the silicon interconnect bridge dedicated to communication between dies; and
   a repeater circuit electrically coupled to the silicon interconnect bridge along a communication path between the first semiconductor die and the second semiconductor die.

8. The semiconductor device of claim 7, further comprising:
   a repeater die, including the repeater circuit; and
   wherein the repeater die is attached to the substrate between the first semiconductor die and the second semiconductor die.

9. The semiconductor device of claim 8, wherein a first edge of the repeater die extends past a first edge of the silicon interconnect bridge creating a first repeater die overhang; and
   Wherein the first repeater die overhang is used for power delivery to the repeater die.

10. The semiconductor device of claim 9, wherein a second edge of the repeater die extends past a second edge of the silicon interconnect bridge creating a second repeater die overhang; and
    wherein the second repeater die overhang is used for power delivery to the repeater die.

11. The semiconductor device of claim 7, further comprising:
    a third semiconductor die attached to the substrate; and
    wherein the third semiconductor die is electrically coupled to the silicon interconnect bridge.

12. The semiconductor device of claim 11, wherein the third semiconductor die is located between the first semiconductor die and the second semiconductor die; and
    wherein the second semiconductor die includes the repeater circuit.

13. The semiconductor device of claim 12, wherein the third semiconductor die is a memory die.

14. The semiconductor device of claim 7, wherein the repeater circuit includes a repeater circuit signal receiver and a repeater circuit signal driver; and wherein the first semiconductor die includes a first signal receiver and a first signal driver;

wherein the second semiconductor die includes a second signal receiver and a second signal driver;

wherein the repeater circuit signal receiver, the first signal receiver, and the second signal receiver are the same size; and wherein the repeater circuit, signal driver, the first signal driver, and the second signal driver are the same size.

15. The semiconductor device of claim 7, wherein the repeater circuit is included in the silicon interconnect bridge.

16. The semiconductor device of claim 15, wherein the repeater circuit is powered via the silicon interconnect bridge.

17. A method comprising:

embedding, at least partially, a lithographically created silicon interconnect bridge in a substrate, the silicon interconnect bridge dedicated to communication between dies;

attaching a first semiconductor die to the substrate, including electrically coupling the first semiconductor to a first end of the silicon interconnect bridge;

attaching a second semiconductor die to the substrate, including electrically coupling the second semiconductor die to the silicon interconnect bridge; and coupling, electrically, a repeater circuit to the silicon interconnect bridge along a communication path between the first semiconductor die and the second semiconductor die.

18. The method of claim 17, wherein the second semiconductor die is electrically coupled to a second end of the silicon interconnect bridge; and wherein the repeater circuit is located in between the first end and the second end of the silicon interconnect bridge.

19. The method of claim 17, further including:

attaching a third semiconductor die to the substrate, including electrically coupling the third semiconductor die to the silicon interconnect bridge;

wherein the repeater circuit is included in the second semiconductor die; and wherein the second semiconductor die is electrically coupled to the silicon interconnect bridge in between the first semiconductor die and the third semiconductor die.

* * * * *